United States Patent [19]

Shiotsu et al.

[11] Patent Number: 5,229,660

[45] Date of Patent: Jul. 20, 1993

[54] INTEGRATED CIRCUIT WITH MEANS TO PREVENT ITS LOGIC OUTPUT CIRCUIT BREAKDOWN

[75] Inventors: Shinichi Shiotsu; Masahiro Tanaka, both of Kawasaki, Japan

[73] Assignee: Fujitsu Limited, Kanagawa, Japan

[21] Appl. No.: 644,780

[22] Filed: Jan. 23, 1991

[30] Foreign Application Priority Data

Jan. 29, 1990 [JP] Japan .................. 2-16207

[51] Int. Cl.⁵ ............... H03K 19/03; H03K 17/16
[52] U.S. Cl. .................................. 307/454; 361/91; 307/456; 307/544; 307/443
[58] Field of Search ............... 307/454, 455, 456, 458, 307/443, 475, 542, 544, 551, 559, 561, 566; 361/91, 101, 111

[56] References Cited

U.S. PATENT DOCUMENTS

| | | | |
|---|---|---|---|
| 4,678,950 | 7/1987 | Mitake ................ | 361/91 |
| 4,739,437 | 4/1988 | Morgan .............. | 361/91 |
| 4,771,191 | 9/1988 | Estrada .............. | 307/456 X |
| 4,803,383 | 2/1989 | Hirochi .............. | 307/456 |
| 4,841,176 | 6/1989 | Millhollan et al. ... | 307/456 X |
| 4,899,098 | 2/1990 | Gariboldi ............ | 361/91 |
| 5,036,225 | 7/1991 | Matsumoto ......... | 307/456 X |
| 5,053,643 | 10/1991 | Tanaka et al. ...... | 361/91 |
| 5,119,263 | 6/1992 | Gariboldi et al. ... | 361/91 |

Primary Examiner—Edward P. Westin
Assistant Examiner—Andrew Sanders
Attorney, Agent, or Firm—Nikaido, Marmelstein, Murray & Oram

[57] ABSTRACT

An integrated circuit comprising a logic output circuit (10) having a resisting voltage condition which is a predetermined voltage lower than a low voltage level in an output terminal of the logic output circuit, conducting unit (11) connected to the output terminal of the logic output circuit for conducting when voltage exceeding the resisting voltage condition of the logic output circuit is applied to the output terminal, trigger-voltage generating unit (12) connected to the conducting unit for generating a trigger voltage when the conducting unit conducts, and control unit (13) provided between the trigger-voltage generating unit and the logic output circuit to turn off the logic output circuit in response to the trigger voltage from the trigger-voltage generating unit.

12 Claims, 4 Drawing Sheets

INTEGRATED CIRCUIT WITH MEANS TO PREVENT ITS LOGIC OUTPUT CIRCUIT BREAKDOWN

FIELD OF THE INVENTION

The present invention relates in general to an integrated circuit including a logic output circuit, and in particular to such an integrated circuit wherein the resisting voltage of the logic output circuit at the output terminal is increased when voltage exceeding a recommended operation condition of the logic output circuit is applied to the output terminal.

DESCRIPTION OF THE PRIOR ART

In a system wherein such a bidirectional data bus as used in a LAN (Local Area Network) is held in common by a plurality of bus receivers and drivers, the data transfer speed between the bus and the bus receivers and drivers is required to be much faster. At the same time, it is also required to protect the bus receivers and drivers from unwanted overvoltage (voltage over a recommended operating condition and below a maximum rating) that is applied through the bus. If the data bus is long, noise will tend to enter, and unwanted overvoltage will tend to be applied.

By way of example, a conventional logic output circuit that is used as the bus driver described above is shown in FIG. 1. In FIG. 1, a logic output circuit 1 is turned on and off in response to a binary logic input signal from an input circuit (not shown) or internal circuit. The logic output circuit 1 comprises a first switch circuit 2, a second switch circuit 3, and a transistor Q4 which makes a logic level of the output terminal high or low by turning on either the first switch circuit 2 or second switch circuit 3. The first switch circuit 2 is constituted by a diode D1 and transistors Q1 and Q2. The second switch circuit 3 is constituted by a diode D2 and a transistor Q3. The logic output circuit 1 further comprises a resistor R2 generating voltage proportional to the emitter current of the transistor Q3, a transistor Q6 in which the voltage generated in the resistor R2 is applied to the base thereof and which operates to decrease the emitter current of the transistor Q3 if the base voltage of Q6 varies in a rising direction, a resistor R1 generating voltage proportional to the emitter current of the transistor Q2, and a transistor transistor Q5 in which the voltage generated in the resistor R1 is applied to the base thereof and which operates to decrease the emitter currents of the transistors Q1 and Q2 if the base voltage of Q5 varies in a rising direction.

That is to say, when an input S1 is a logic 0, the transistor Q4 is turned off and the transistors Q1 and Q2 of the first switch circuit 2 are turned on, so the output terminal of the logic circuit 1 goes to a logic 1 or a logic high level. When, on the other hand, the input S1 is a logic 1, the transistor Q4 is turned on and the transistor Q3 of the second switch circuit 3 is turned on, so the output terminal of the logic output circuit 1 goes to a logic 0 or a logic low level. In a case where overvoltage is applied to the output terminal of the logic output circuit 1, the transistor Q6 controls the emitter current of the transistor Q3 when it is turned on and the transistor Q5 controls the emitter currents of the transistors Q1 and Q2 when they are turned on. In this manner, by controlling the emitter currents of the transistors Q1, Q2 and Q3, these transistors are prevented from being broken down.

However, since in the conventional logic output circuit of the above type the resisting voltage of the circuit at the output terminal side is determined by the characteristics of the transistors Q1–Q6, there is the drawback that the resisting voltage does not satisfy the maximum rating of, for example, RS 485 standard in EIA (Electronic Industries Association) STANDARD that is commonly applied to ICs (integrated circuits).

The RS 485 standard described above is applied to bus receivers and drivers having a common bidirectional bus line, the recommended operating condition is above −7 V, and the maximum rating of the RS 485 standard that is commonly applied to ICs is −10 V.

The resisting voltage $V_O$ of the output of the conventional logic output circuit of FIG. 1 is determined by the resisting voltage $BV_{CE1}$ between the collector and emitter of the transistor Q1 or resisting voltage $BV_{CE2}$ between the collector and emitter of the transistor Q2. The resisting voltage $V_O$ will become:

$$V_O BV_{CE1} = BV_{CE2} = -10V$$

Since the resisting voltage of −10 V is substantially the maximum rating of the RS 485 standard, there is the possibility that the transistors Q1 and Q2 fail or break down, when overvoltage of the order of the maximum rating is applied from the outside. As the countermeasure, by making the epitaxial layers of the transistors Q1 and Q2 thick, the resisting voltage $BV_{CE1}$ between the collector and emitter of the transistor Q1 and the resisting voltage $BV_{CE2}$ between the collector and emitter of the transistor Q2 may be increased to satisfy the RS 485 standard. However, if the epitaxial layer is made thick, the collector resistance becomes large and thereby results in a decrease in the signal transfer speed.

It is therefore an object of the present invention to provide an improved integrated circuit which is capable of preventing the breakdown of the logic output circuit by increasing the resisting voltage of the logic output circuit as overvoltage is applied.

SUMMARY OF THE INVENTION

In order to achieve the above object, an integrated circuit according to the present invention comprises a logic output circuit 10, as shown in FIG. 2. The logic output circuit 10 shown in FIG. 2 can comprise a logic output circuit that is commonly used. For example, the logic output circuit 10 may comprise a logic output circuit such as that shown in FIG. 3. In the logic output circuit shown in FIG. 2, when an applied voltage in the input side is a logic 0, the logic in the output side goes to a 1 or a high level, and when the applied voltage in the input side is a logic 1, the logic in the output side goes to a 0 or a low level.

In accordance with the present invention, conducting means 11 is connected to the output terminal of the logic output circuit 10. When overvoltage exceeding the resisting voltage of the logic output circuit 10, which voltage is mainly determined by the transistors constituting the logic output circuit, is applied to the output side of the logic output circuit, the conducting means 11 conducts and supplies an output signal to trigger-voltage generating means 12. Although there is a slight difference in resisting voltage between logic output circuits manufactured by the individual integrated circuit manufacturers, the EIA STANDARD described above is used and a recommended operating condition is set for each of the integrated circuits. Accordingly, it is assumed that voltage exceeding the recommended operating condition is overvoltage. In the present invention, the overvoltage described above is preferable to be a lower voltage than a low voltage level among the logic circuit output levels. However, the voltage level of the overvoltage described above is not limited to a particular voltage level and can be set to an optimum value, depending upon a logic output circuit to be used. In the embodiment of the present invention, it is preferable that the overvoltage be between $-7$ V and $-10$ V in view of the EIA STANDARD described above. Therefore, the threshold voltage of the conducting means 11 according to the present invention can also be set in accordance with the above description. The conducting means can comprise means having a function of conducting as a predetermined overvoltage is applied, and the circuit construction is not limited. For example, the conducting means may comprise a plurality of diodes or transistors connected in series. The conducting means may also comprise the combination of diodes and transistors.

In accordance with the present invention, trigger-voltage generating means 12 is connected to the output of the conducting means 11 and generates a trigger voltage $V_T$ proportional to the predetermined threshold voltage of the conducting means 11 when it conducts. The internal construction of the trigger-voltage generating means 12 is also not limited. For example, by using a resistance type potential divider, an output having a predetermined ratio with respect to the input can be obtained.

In accordance with the present invention, control means 13 is provided between the trigger-voltage generating means 12 and the logic output circuit 10 and receives the trigger voltage $V_T$ outputted from the trigger-voltage generating means 12. The control means 13, in response to receiving the trigger voltage $V_T$, causes the logic output circuit 10 to be in its off state or high impedance state. In this manner, the logic output circuit 10 is caused to be turned off temporarily. Consequently, since the resisting voltage between the collector and emitter of the transistor in the logic output circuit 10 is increased temporarily, the output circuit 10 can be prevented from being broken down by an input of overvoltage.

In accordance with another important aspect of the present invention, there is provided an integrated circuit comprising a logic output circuit (10), first conducting means (11), first trigger-voltage generating means (12), first control means (13), second conducting means (21), second trigger-voltage generating means (22), and second control means (23). The integrated circuit is provided in accordance with the present invention in order to satisfy both the maximum rating of $-10$ v and the maximum rating of 15 V of RS 485 standard of EIA (Electronic Industries Association) STANDARD that is commonly applied to ICs. For this purpose, the logic output circuit (10) has a first resisting voltage condition which is a predetermined voltage lower than a low voltage level in an output terminal of the logic output circuit and has a second resisting voltage condition which is a predetermined voltage higher than a high voltage level in the output terminal of the logic output circuit. The first conducting means (11) is connected to the output terminal of the logic output circuit for conducting when voltage exceeding the first resisting voltage condition of the logic output circuit is applied to the output terminal. The first trigger-voltage generating means (12) is connected to the first conducting means for generating a first trigger voltage when the first conducting means conducts. The first control means (13) is provided between the first trigger-voltage generating means and the logic output circuit to turn off the logic output circuit in response to the first trigger voltage from the first trigger-voltage generating means. The second conducting means (21) is connected to the output terminal of the logic output circuit for conducting when voltage exceeding the second resisting voltage condition of the logic output circuit is applied to the output terminal. The second trigger-voltage generating means (22) is connected to the second conducting means for generating a second trigger voltage when the second conducting means conducts. The second control means (23) is provided between the second trigger-voltage generating means and the logic output circuit to connect an input terminal of the logic output circuit with a power line of voltage corresponding to a logic low.

BRIEF DESCRIPTION OF THE DRAWINGS

The drawbacks of a conventional integrated circuit and the features and advantages of an integrated circuit according to the present invention will be more clearly understood from the following description taken in conjunction with the accompanying drawings.

DESCRIPTION OF THE PREFERRED EMBODIMENTS

Figure 2:
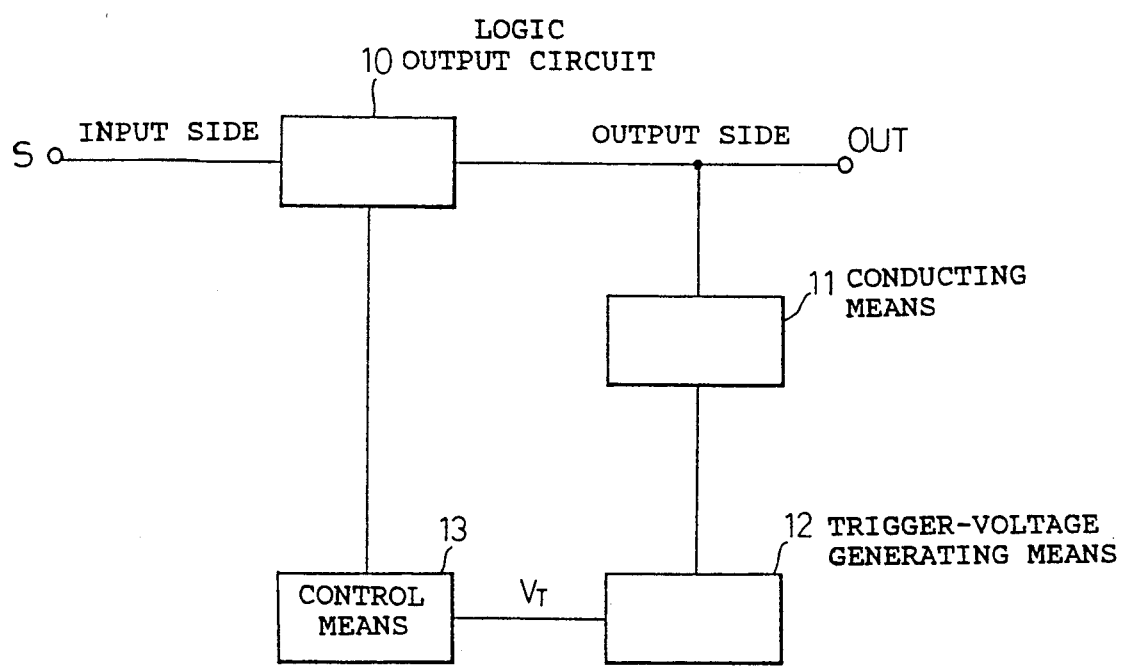
FIG. 2 is a block diagram used to explain the principles of the present invention.
Figure 3:
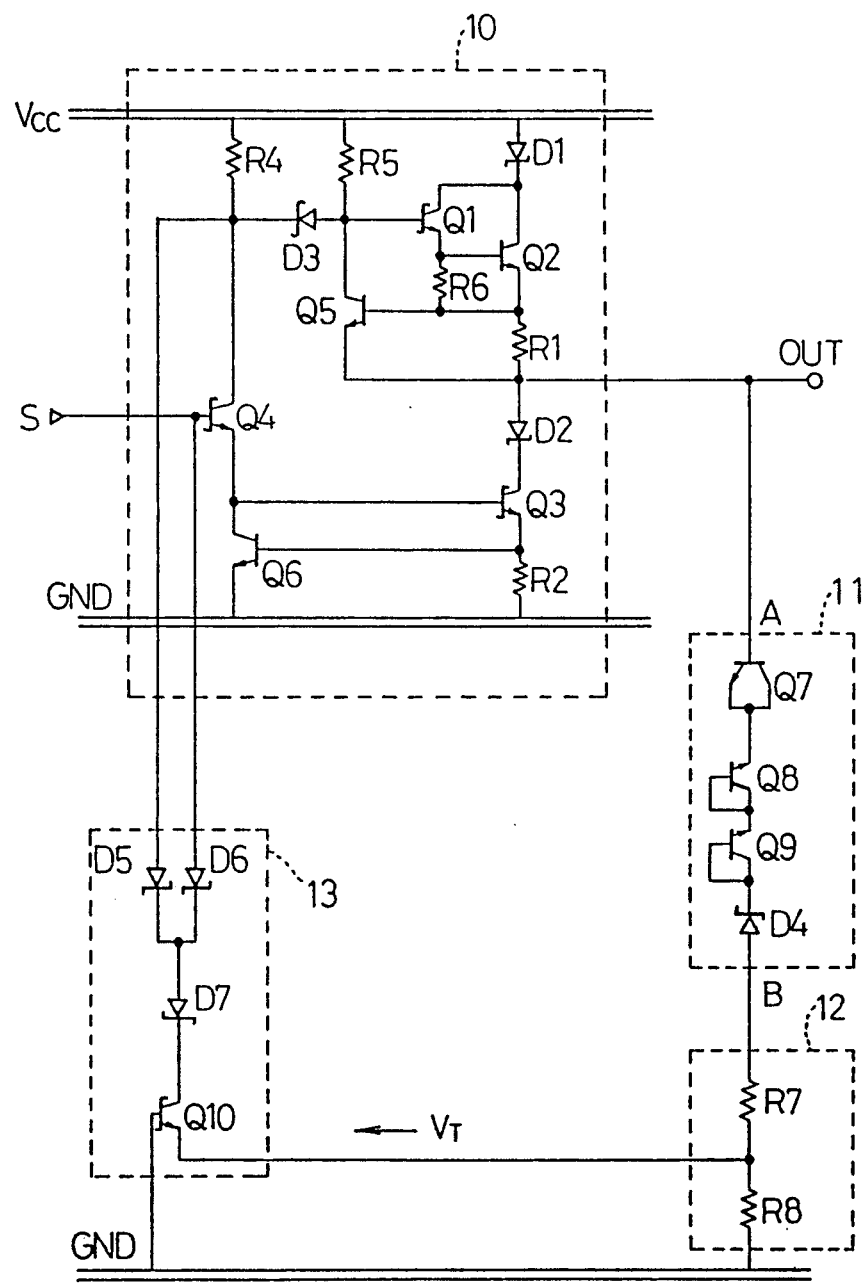
FIG. 3 is a schematic view representing one embodiment of the integrated circuit according to the present invention.

With reference to FIG. 3, there is shown a preferred embodiment of an integrated circuit in accordance with the present invention. The same reference numerals and characters will be applied to the same parts as those of FIG. 2.

Figure 1:
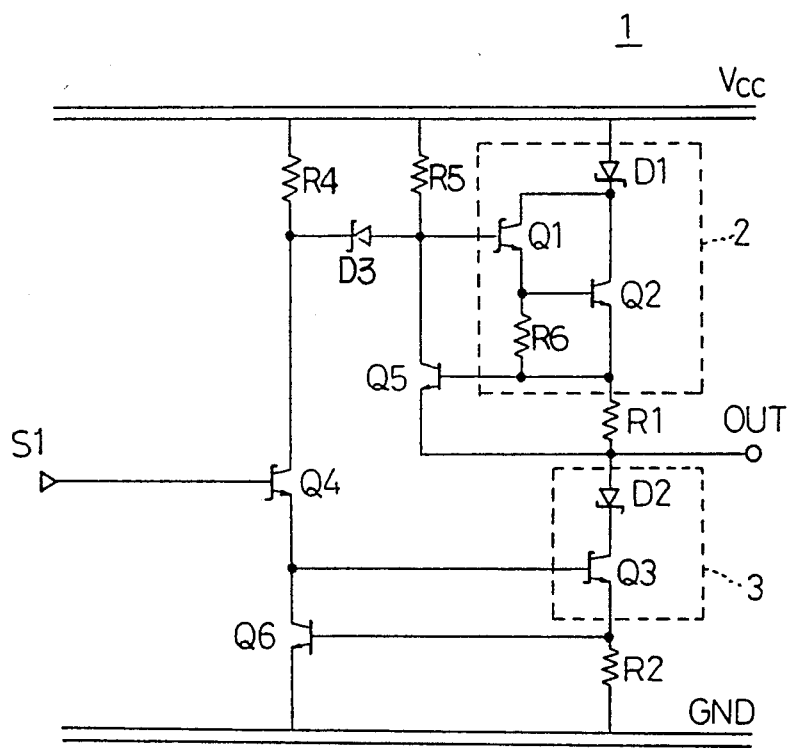
FIG. 1 is a schematic view representing a conventional integrated circuit.

In FIG. 3, reference numeral 10 is a logic output circuit, 11 conducting means, 12 trigger-voltage generating means, and 13 control means. The logic output circuit 10 is substantially identical in construction with that of FIG. 1 and thus comprises transistors Q1–Q6, schottky diodes D1–D3, and resistors R1–R6. Note that transistors Q1, Q3 and Q4 are provided with schottky diodes, respectively. The conducting means 11 has its one end A connected with the output terminal of the logic output circuit 10 and has the other end B connected with the ground through the trigger-voltage generating means 12. Between the ends A and B of the conducting means 11, there are provided transistors Q7, Q8, Q9 and a schottky diode D4 which are connected in series. Note that the transistor Q7 functions as a diode and that the collector of Q7 may be left open, as the case may be. The trigger-voltage generating means 12 comprises resistors R7 and R8, which are connected in series. When the conducting means 11 conducts, the trigger-voltage generating means 12 is caused to be connected with the output terminal of the logic output circuit 10 so that a trigger voltage $V_T$ proportional to the voltage in the output terminal of the logic output circuit 10 can be generated across the resistor R8. The conducting means 11 is designed to conduct when the voltage between the ends A and B exceeds a predetermined voltage $V_X$. The predetermined voltage $V_X$ is equal to the sum of the backward resisting voltage $BV_{EB07}$ of the emitter and base of Q7, the forward resisting voltage $V_{BE008}$ of Q8, the forward resisting voltage $V_{BE009}$ of Q9, and the forward voltage of $V_{F04}$ of D4:

$$IV_X \unicode{8805} BV_{EB07} + V_{BE08} + V_{BE09} + V_{F04}$$

The transistor Q10 with a schottky diode of the control means 13, in response to receiving the trigger voltage $V_T$ from the trigger-voltage generating means 12, causes the transistor Q4 or Q1 of the logic output circuit 10 to be turned off through a schottky diode D7, D5 or D6. In this manner, the logic output circuit 10 is caused to be in its off state or high impedance state. In this embodiment of the present invention, the above described transistor Q10 and schottky diodes D5, D6 and D7 as a whole constitute the control means 13.

The operation of the embodiment of FIG. 3 will hereinafter be described in detail.

The voltage in the output terminal of the logic output circuit 10 varies in accordance with the input logic to the circuit 10. For example, when an applied voltage in the input side of the circuit 10 is a logic 0, the voltage in the output side goes to a 1 or a high level, and when the applied voltage in the input side is a logic 1, the voltage in the output side goes to a 0 or a low level. As long as the voltage in the output terminal of the logic output circuit 10 varies between the power voltage Vcc and the ground, the resisting voltage of the circuit 10 at the output side is sufficiently satisfied.

Assume now that the overvoltage $V_X$ is applied to the output terminal of the logic output circuit 10 from the outside for some reasons. When the overvoltage $V_X$ is below the resisting voltage $V_O$ in the output terminal, there is no problem. However, if the overvoltage $V_X$ exceeds the resisting volta $V_O$, there is the possibility that in the conventional example shown in FIG. 1 the transistors Q1 and Q2 are broken down. In the present invention, as compared with the conventional example, the conducting means 11 is caused to conduct immediately when the overvoltage $V_X$ is applied, and the logic output circuit 10 is turned off. Consequently, there are no breakdowns of transistors Q1 and Q2. This is because the voltage that the conducting means 11 conducts is set to $V_X = BV_{EB07} + V_{BE008} + V_{BE009} + V_{F04}$ or because $V_X$ is slightly lower than $V_O$. Therefore, the trigger voltage $V_T$ is generated across the resistor R8 of the trigger-voltage generating means 12 immediately before the voltage in the output terminal of the circuit 10 exceeds the resisting voltage $V_O$. In response to the trigger voltage $V_T$ from the trigger-voltage generating means 12, the transistor Q10 of the control means 13 is turned on. As a result, since the base voltages of the transistors Q1 and Q2 of the logic output circuit 10 become substantially the ground voltage and the transistors Q1-Q4 become in their off state, the resisting voltage of the logic output circuit 10 at the output terminal is increased from $-10$ V ($BV_{CE}$: the resisting voltage between the collector and emitter of the transistor which is in its on state) to $-12$ V ($BV_{CEO}$: the resisting voltage between the collector and emitter of the transistor which is in its off state). Accordingly, the integrated circuit according to the present invention can fully satisfies the maximum rating ($-10$ V) of RS 485 standard of EIA (Electronic Industries Association) STANDARD that is commonly applied to ICs.

Figure 4:
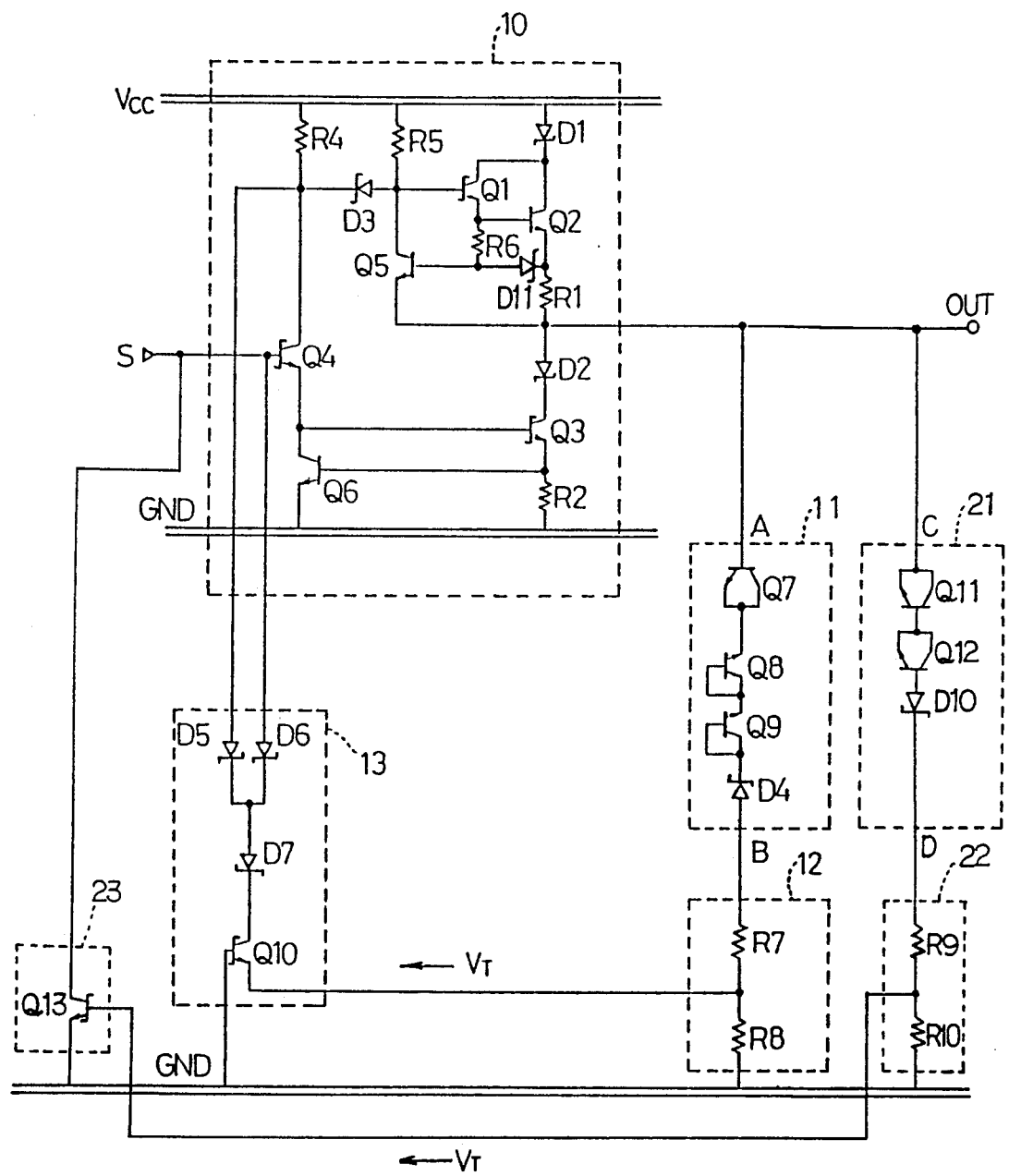
FIG. 4 is a schematic view representing another embodiment of the integrated circuit according to the present invention.

FIG. 4 schematically illustrates another embodiment of the integrated circuit in accordance with the present invention. The same reference numerals and characters will be applied to the same parts as those of FIG. 3 and therefore a description of the same parts will not be given. The embodiment of FIG. 4 comprises a logic output circuit 10, first conducting means 11, first trigger-voltage generating means 12 and first control means 13. Since the logic output circuit 10, first conducting means 11, first trigger-voltage generating means 12 and first control means 13 are fully described in the embodiment of FIG. 3, a description of these parts will not be given. As described above, the maximum rating ($-10$ V) of RS 485 standard of EIA (Electronic Industries Association) STANDARD is fully satisfied by the conducting means 11, trigger-voltage generating means 12 and control means 13. In order to satisfy the the maximum rating (15 V and below) of RS 485 standard of EIA STANDARD, the FIG. 4 embodiment further comprises second conducting means 21, second trigger-voltage generating means 22 and second control means 23. The FIG. 4 embodiment is further characterized in that a schottky barrier diode D11 is provided in the logic output circuit 10 so that the anode of the diode D11 is connected to the base of a transistor Q5 and the cathode of the diode 11 is connected to one end of a resistor R1. If there is no schottky barrier diode D11, a transistor Q10 of the first control means 13 will be broken down through Q5, D3, D5 and D7. This is because the voltage between the collector and emitter of Q10 is not relatively high.

The second conducting means 21 has its one end C connected with the output terminal of the logic output circuit 10 and has the other end D connected with the ground through the second trigger-voltage generating means 22. Between the ends C and D of the second conducting means 21, there are provided transistors Q11, Q12, and a schottky diode D10 which are connected in series. The second trigger-voltage generating means 22 comprises resistors R9 and R10, which are connected in series. When the second conducting means 21 conducts, the second trigger-voltage generating means 22 is caused to be connected with the output terminal of the logic output circuit 10 so that a second trigger voltage $V_T$ proportional to the voltage in the output terminal of the logic output circuit 10 can be generated across the resistor R10. The second conducting means 21 is designed to conduct when the voltage between the ends C and D exceeds a predetermined high voltage $V_X$. The predetermined high voltage $V_X$ is equal to the sum of the backward resisting voltage $BV_{EB11}$ of the emitter and base of Q11, the backward resisting voltage $BV_{EB12}$ of Q12, and the forward voltage of $V_{F10}$ of D10:

$$V_X = BV_{EB11} + BV_{EB12} + V_{F10}$$

The transistor Q13 with a schottky diode of the second control means 23, in response to receiving the second trigger voltage $V_T$ from the second trigger-voltage generating means 22, is tuned on, and the input side of the logic output circuit 10 is caused to be connected with a power line of voltage corresponding to a logic 0

(e.g., ground). As a result, the output side logic of the circuit 10 is caused to go to a logic 1.

The operation of the embodiment of FIG. 4 will hereinafter be described in detail.

As previously described, the voltage in the output terminal of the logic output circuit 10 varies in accordance with the input logic to the circuit 10. That is, when an applied voltage in the input side of the circuit 10 is a logic 0, the voltage in the output side goes to a 1 or a high level, and when the applied voltage in the input side is a logic 1, the voltage in the output side goes to a 0 or a low level. As long as the voltage in the output terminal of the logic output circuit 10 varies between the power voltage Vcc and the ground, the resisting voltage of the circuit 10 at the output side is sufficiently satisfied.

Assume now that overvoltage is applied to the output terminal of the logic output circuit 10 from the outside for some reasons. When the overvoltage is below a resisting voltage $V_{OL}$ as the output logic of the circuit 10 is a 1, there is no problem. However, if the overvoltage exceeds the resisting voltage $V_{OL}$, there is the possibility that in the conventional example shown in FIG. 1 the transistors Q1 and Q2 are broken down. In the present invention, as compared with the conventional example, the second conducting means 21 is caused to conduct immediately when the overvoltage is applied. Consequently, there are no breakdowns of transistors Q1 and Q2. This is because the voltage that the second conducting means 21 conducts is set to $V_X = BV_{EB11} + BV_{EB12} + V_{F10}$ or because $V_X$ is slightly lower than $V_{OL}$. The second trigger voltage $V_T$ is generated across the resistor R10 of the second trigger-voltage generating means 22 immediately before the voltage in the output terminal of the circuit 10 exceeds the resisting voltage $V_{OL}$. In response to the second trigger voltage $V_T$ from the second trigger-voltage generating means 22, the transistor Q13 of the second control means 23 is turned on. As a result, since the base voltage of Q4 becomes substantially the ground voltage and the output side logic of the circuit 10 is caused to go to a logic 1, the resisting voltage of the logic output circuit 10 at the output terminal is increased from $V_{OL}$ to 16 V (Vcc(5 V)+$BV_{EB01}$(5.5 V)+$BV_{EB02}$(5.5 V)). Accordingly, the integrated circuit according to the present invention can fully satisfies the maximum rating (15 V and below) of RS 485 standard of EIA (Electronic Industries Association) STANDARD that is commonly applied to ICs. In this manner, the embodiment of FIG. 4 can satisfies both the maximum rating of −10 v and the maximum rating of 15 V.

Although the invention has been described with a certain degree of particularity, it is understood that the present disclosure has been made only by way of example and that numerous changes in the details of the construction and the combination and arrangement of parts may be made without departing from the scope of the invention as hereinafter claimed.

What we claim is:

1. An integrated circuit comprising:
   a logic output circuit having a resisting voltage condition which is a predetermined voltage lower than a low voltage level in an output terminal of said logic output circuit;
   conducting means connected to said output terminal of said logic output circuit for conducting when voltage exceeding said resisting voltage condition of said logic output circuit is applied to said output terminal, said conducting means including transistors and diodes which are connected in series;
   trigger-voltage generating means connected to said conducting means for generating a trigger voltage when said conducting means conducts; and
   control means provided between said trigger-voltage generating means and said logic output circuit to turn off said logic output circuit in response to said trigger voltage from said trigger-voltage generating means.

2. An integrated circuit as set forth in claim 1, wherein said logic output circuit is constructed such that when an applied voltage in an input terminal of said output circuit is a logic 0, voltage in said output terminal of said output circuit goes to a high voltage corresponding to a logic 1, and that when said applied voltage in said input terminal is a logic 1, said voltage in said output terminal goes to a low voltage corresponding to a logic 0.

3. An integrated circuit as set forth in claim 1, wherein said trigger-voltage generating means comprises a plurality of resistors.

4. An integrated circuit as set forth in claim 1, wherein said control means comprises a transistor with a schottky diode, and a plurality of schottky diodes.

5. An integrated circuit comprising:
   a logic output circuit having a first resisting voltage condition which is a predetermined voltage lower than a low voltage level in an output terminal of said logic output circuit and having a second resisting voltage condition which is a predetermined voltage higher than a high voltage level in said output terminal of said logic output circuit;
   first conducting means connected to said output terminal of said logic output circuit for conducting when voltage exceeding said first resisting voltage condition of said logic output circuit is applied to said output terminal;
   first trigger-voltage generating means connected to said first conducting means for generating a first trigger voltage when said first conducting means conducts;
   first control means provided between said first trigger-voltage generating means and said logic output circuit to turn off said logic output circuit in response to said first trigger voltage from said first trigger-voltage generating means;
   second conducting means connected to said output terminal of said logic output circuit for conducting when voltage exceeding said second resisting voltage condition of said logic output circuit is applied to said output terminal;
   second trigger-voltage generating means connected to said second conducting means for generating a second trigger voltage when said second conducting means conducts; and
   second control means provided between said second trigger-voltage generating means and said logic output circuit to connect an input terminal of said logic output circuit with a power line of voltage corresponding to a logic low.

6. An integrated circuit as set forth in claim 5, wherein a schottky barrier diode is provided between said output terminal of said logic output circuit and said first control means so that the anode of said diode is connected to said first control means and the cathode of said diode is connected to said output terminal of said logic output circuit.

7. An integrated circuit as set forth in claim 5, wherein said logic output circuit is constructed such that when an applied voltage in said input terminal of said output circuit is a logic 0, voltage in said output terminal of said output circuit goes to a high voltage corresponding to a logic 1 and when said applied voltage in said input terminal is a logic 1, said voltage in said output terminal goes to a low voltage corresponding to a logic 0.

8. An integrated circuit as set forth in claim 5, wherein said first conducting means comprises transistors and diodes which are connected in series and wherein said second conducting means comprises transistors and diodes which are connected in series.

9. An integrated circuit as set forth in claim 5, wherein said first conducting means comprises diodes which are connected in series and wherein said second conducting means comprises diodes which are connected in series.

10. An integrated circuit as set forth in claim 5, wherein said first conducting means comprises transistors which are connected in series and wherein said second conducting means comprises transistors which are connected in series.

11. An integrated circuit as set forth in claim 5, wherein said first trigger-voltage generating means comprises a plurality of resistors and wherein said second trigger-voltage generating means comprises a plurality of resistors.

12. An integrated circuit as set forth in claim 5, wherein said first control means comprises a transistor with a schottky diode, and a plurality of schottky diodes and wherein said second control means comprises a transistor with a schottky diode.

* * * * *